(12) United States Patent
Chang et al.

(10) Patent No.: US 12,324,092 B2
(45) Date of Patent: Jun. 3, 2025

(54) INTEGRATED CIRCUIT AND SIGNAL TRANSMISSION METHOD

(71) Applicant: Realtek Semiconductor Corporation, Hsinchu (TW)

(72) Inventors: Li Chung Chang, Hsinchu (TW); Shih Min Yen, Hsinchu (TW); Meng An Kuo, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 261 days.

(21) Appl. No.: 18/301,273

(22) Filed: Apr. 17, 2023

(65) Prior Publication Data

US 2024/0172357 A1  May 23, 2024

(30) Foreign Application Priority Data

Nov. 17, 2022 (TW) .................................. 111143907

(51) Int. Cl.
*H05K 1/02* (2006.01)
*H05K 1/18* (2006.01)

(52) U.S. Cl.
CPC ......... *H05K 1/0245* (2013.01); *H05K 1/0219* (2013.01); *H05K 1/181* (2013.01)

(58) Field of Classification Search
CPC ... H05K 1/0245; H05K 1/0219; H05K 1/0216
See application file for complete search history.

(56) References Cited

U.S. PATENT DOCUMENTS

| | | | | |
|---|---|---|---|---|
| 7,609,125 | B2* | 10/2009 | van Quach | H01L 23/66 333/34 |
| 2004/0196112 | A1* | 10/2004 | Welbon | H05K 1/0221 333/1 |
| 2015/0282300 | A1* | 10/2015 | Kagaya | H05K 1/0245 398/135 |
| 2019/0164891 | A1* | 5/2019 | Bird | H10F 77/93 |

FOREIGN PATENT DOCUMENTS

| | | |
|---|---|---|
| TW | 202105140 A | 2/2021 |
| TW | 202221490 A | 6/2022 |

* cited by examiner

*Primary Examiner* — Sherman Ng
(74) *Attorney, Agent, or Firm* — CKC & Partners Co., LLC

(57) ABSTRACT

An integrated circuit is disclosed. The integrated circuit is coupled to a circuit board. The circuit board includes several signal pair channels. The integrated circuit includes several output terminals and a control circuit. The control circuit is configured to configure several output signals output to several signal pair channels by several output terminals, so that a first signal pair channel and a second signal pair channel of several signal pair channels receive and output several output signals, so that a third signal pair channel of several signal pair channels shields an interference between the first signal pair channel and the second signal pair channel. The third signal pair channel is adjacent to the first signal pair channel and the second signal pair channel, and the third signal pair channel is located between the first signal pair channel and the second signal pair channel.

20 Claims, 6 Drawing Sheets

INTEGRATED CIRCUIT AND SIGNAL TRANSMISSION METHOD

CROSS-REFERENCE TO RELATED APPLICATION

This application claims the priority benefit of TAIWAN Application serial no. 111143907, filed Nov. 17, 2022, the full disclosure of which is incorporated herein by reference.

FIELD OF INVENTION

The present application relates to an integrated circuit and a signal transmission method. More particularly, the present application relates to an integrated circuit and a signal transmission method of high speed signal transmission.

BACKGROUND

Traditionally, for the signal interference (crosstalk) problem between the signal pair channels at the interface where the integrated circuit is connected to the circuit board, the signal interference problem is reduced by increasing the distance between the signal pair channels, inserting the ground wires in between the signal pair channels, increasing the number of layers of the circuit board to add grounding layers, etc.

However, the method mentioned above must be realized by reserving a large space at the interface where the integrated circuit is connected to the circuit board, so that a dummy pin can be set, and the number of layers of the circuit board can be increased, etc., which will cause the overall area or volume of the integrated circuit and the circuit board is larger, which in turn makes the manufacturing cost higher.

SUMMARY

The disclosure provides an integrated circuit. The integrated circuit is coupled to a circuit board, the circuit board includes several signal pair channels. The integrated circuit includes several output terminals and a control circuit. The control circuit is coupled to several output terminals, and the control circuit is configured to configure several output signals output to several signal pair channels by several output terminals, so that a first signal pair channel and a second signal pair channel of several signal pair channels receive and output several output signals, so that a third signal pair channel of several signal pair channels shields an interference between the first signal pair channel and the second signal pair channel. The third signal pair channel is adjacent to the first signal pair channel and the second signal pair channel, and the third signal pair channel is located between the first signal pair channel and the second signal pair channel.

The disclosure provides a signal transmission method. The signal transmission method is suitable for an integrated circuit. The integrated circuit is coupled to a circuit board, the circuit board includes several signal pair channels. The signal transmission method includes the following operations: configuring several output signals output to several signal pair channels of the integrated circuit by several output terminals by a control circuit of the integrated circuit; and outputting several output signals by several output terminals of the integrated circuit, so that a first signal pair channel and a second signal pair channel of several signal pair channels receive and output several output signals, so that a third signal pair channel of several signal pair channels shields an interference between the first signal pair channel and the second signal pair channel. The third signal pair channel is adjacent to the first signal pair channel and the second signal pair channel, and the third signal pair channel is located between the first signal pair channel and the second signal pair channel.

It is to be understood that both the foregoing general description and the following detailed description are by examples and are intended to provide further explanation of the invention as claimed.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

DETAILED DESCRIPTION

Figure 1:
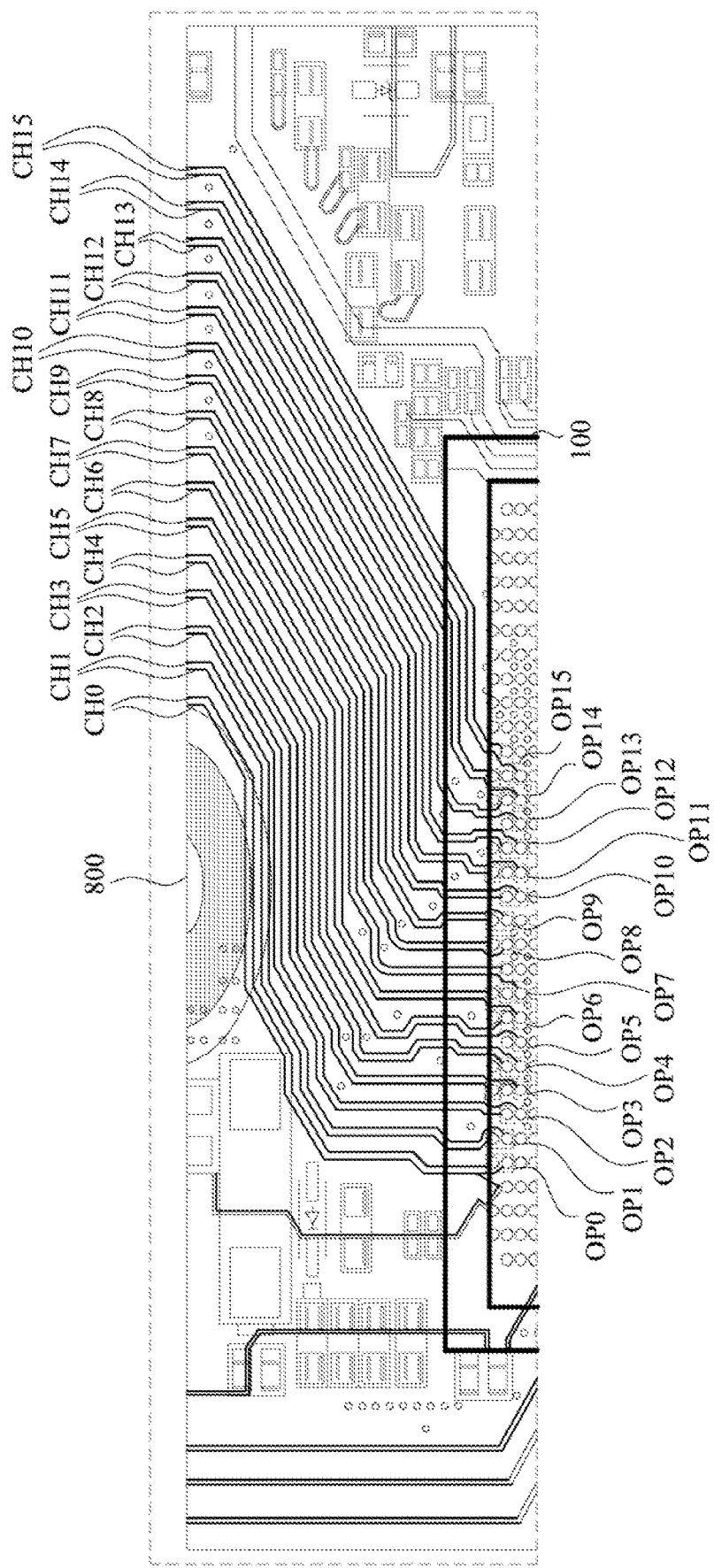
FIG. 1 is a schematic diagram illustrating an integrated circuit according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Reference is made to FIG. 1. FIG. 1 is a schematic diagram illustrating an integrated circuit 100 according to some embodiments of the present disclosure. Take FIG. 1 as an example, the integrated circuit 100 and the circuit board 800 couple to each other. In detail, the integrated circuit 100 includes several output terminals OP0 to OP15, and the circuit board 800 includes several signal pair channels CH0 to CH15. In some embodiments, the several output terminals OP0 to OP15 of the integrated circuit 100 are pins or balls. The several output terminals OP0 to OP15 of the integrated circuit 100 couple to several signal pair channels CH0 to CH15 of the circuit board 800. The numbers of the output terminal and the signal pair channel as mentioned above is for illustrative purposes only, and the embodiments of the present disclosure are not limited thereto.

As illustrated in FIG. 1, several output terminals OP0 to OP15 and several signal pair channels CH0 to CH15 are connected one-to-one, and several output terminals OP0 to OP15 are connected via wires between each other. In detail, the output terminal OP0 and the signal pair channel CH0 are connected to each other, the output terminal OP1 and the signal pair channel CH1 are connected to each other, and so on. Furthermore, the output terminal OP0 is configured to output signals to the signal pair channel CH0, the output terminal OP1 is configured to output signals to the signal pair channel CH1, and so on.

As shown in FIG. 1, since there are many lines between several output terminals OP0 to OP15 and several signal pair channels CH0 to CH15, at the junction between the integrated circuit 100 and the circuit board 800, several signal pair channels CH0 to CH15 are prone to generate signal interference problems. The integrated circuit and the signal transmission method proposed in the embodiments of the present disclosure effectively solve the above problems.

Figure 2:
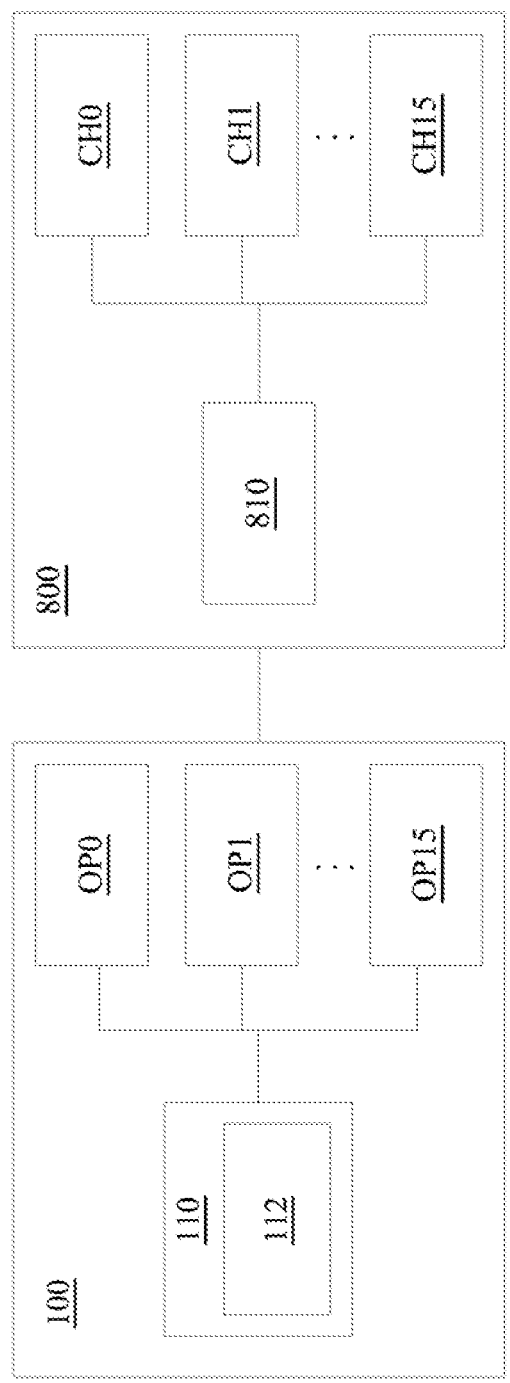
FIG. 2 is a structural diagram illustrating an integrated circuit according to some embodiments of the present disclosure.

Reference is made to FIG. 2. FIG. 2 is a structural diagram illustrating an integrated circuit 100 according to some embodiments of the present disclosure. As illustrated in FIG. 2, the integrated circuit 100 includes a control circuit 110 and several output terminals OP0 to OP15. The control circuit 110 is coupled to the several output terminals OP0 to OP15. The integrated circuit 100 is coupled to the circuit board 800 through the connector 810. In some embodiments, the control circuit 110 includes a multiplexer 112.

The configuration of the integrated circuit 100 as mentioned above is for illustrative purposes only, several configuration of the integrated circuit 100 are within the scope of the present disclosure. The detailed operation method of the integrated circuit 100 will be explained with reference to FIG. 3 below.

Figure 3:
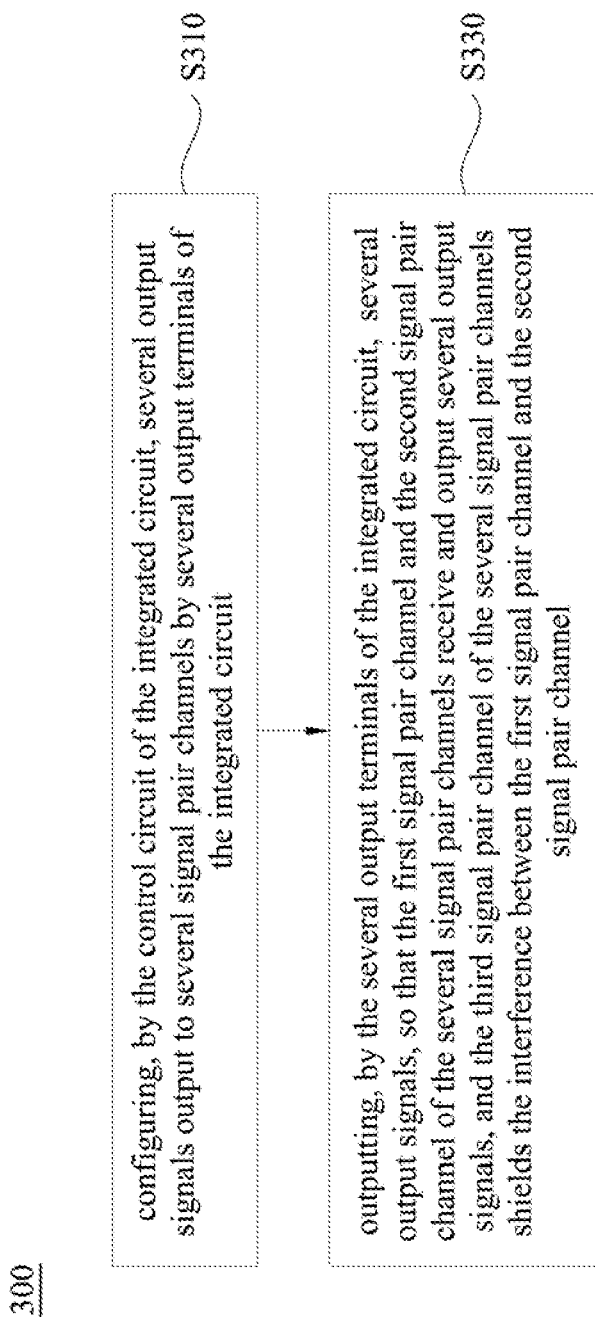
FIG. 3 is a flow chart diagram illustrating a signal transmission method according to some embodiments of the present disclosure.

FIG. 3 is a flow chart diagram illustrating a signal transmission method 300 according to some embodiments of the present disclosure. The signal transmission method 300 can be applied to the integrated circuit 100 as shown in FIG. 1 and FIG. 2. Reference is made to FIG. 1 to FIG. 3. In some embodiments, the signal transmission method 300 is operated by the control circuit 110 as illustrated in FIG. 2.

In operation S310, several output signals output to several signal pair channels by several output terminals of the integrated circuit is configured by the control circuit of the integrated circuit. For example, the output signals output to the signal pair channels CH0 to CH15 by the several output terminals OP0 to OP15 of the integrated circuit 100 is configured by the control circuit 110 of the integrated circuit 100 in FIG. 2.

In operation S330, several output signals are output by the several output terminals of the integrated circuit, so that the first signal pair channel and the second signal pair channel of the several signal pair channels receive and output several output signals, and the third signal pair channel of the several signal pair channels shields the interference between the first signal pair channel and the second signal pair channel.

In operation S330 as mentioned above, the third signal pair channel is adjacent to the first signal pair channel and the second signal pair channel, and the third signal pair channel is located between the first signal pair channel and the second signal pair channel.

For example, the control circuit 110 of the integrated circuit 100 in FIG. 2 configures the several output terminals OP0 to OP15 of the integrated circuit 100 to output the output signals. In some embodiments, reference is made to FIG. 2 together. The output terminals OP0 to OP15 transmits the output signals to the signal pair channels CH0 to CH15 through the connector 810.

Figure 4:
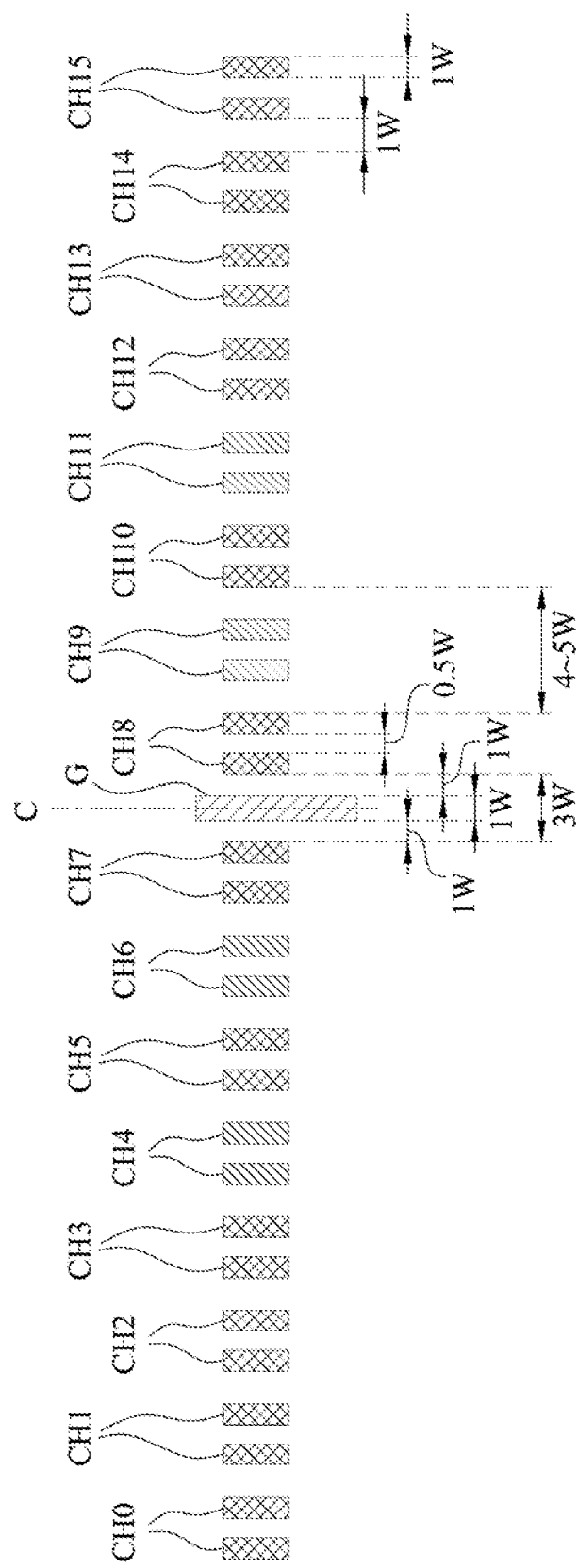
FIG. 4 is a schematic diagram illustrating a signal transmission according to some embodiments of the present disclosure.

For example, reference is made to FIG. 4 together. FIG. 4 is a schematic diagram illustrating a signal transmission according to some embodiments of the present disclosure. As illustrated in FIG. 4, the signal pair channel CH4 is located between the signal pair channel CH3 and the signal pair channel CH5, and the signal pair channel CH4 is adjacent to the signal pair channel CH3 and the signal pair channel CH5. In operation S310 and operation S330, the control circuit 110 in FIG. 2 configures the output terminal OP3 to output the output signals to the signal pair channel CH3, and the control circuit 110 configures the output terminal OP5 to output the output signals to the signal pair channel CH5. At the same time, the control circuit 110 configures the signal pair channel CH4 to be a signal pair channel with a shield effect to shield the interference between the signal pair channel CH3 and the signal pair channel CH5.

In some embodiments, the control circuit 110 in FIG. 2 controls the output terminal OP4 to output the shield signal to the output channel CH4, so that the output channel CH4 has the shield effect.

In some embodiments, the shield signals include the high impedance obstructive state signals. In some embodiments, the shield signals include the direct current voltages.

In some embodiments, the control circuit 110 in FIG. 2 configures the first part of the output terminals OP0 to OP15 to output the output signals to the first part of the signal pair channels CH0 to CH15, and the control circuit 110 configures the second part of the output terminals OP0 to OP15 to not to output the output signals to the signal pair channel or to output the shield signals to the second part of the signal pair channels CH0 to CH15, so that the second part of the signal pair channels CH0 to CH15 shields the interference between the first part of the signal pair channels CH0 to CH15. The second part of the signal pair channels CH0 to CH15, which is used as a shield, is intersected between the first part of the signal pair channels CH0 to CH15.

In some embodiments, the first part of the signal pair channels CH0 to CH15 as mentioned above is used as a signal pair channel for general transmission, and the second part of the signal pair channels CH0 to CH15 is used as a signal pair channel for shield.

For example, reference is made to FIG. 4 again. In FIG. 4, the signal pair channels CH4, CH6, CH9 and CH11 are used as signal pair channels for shield, while the signal pair channels CH1 to CH3, CH5, CH7, CH8, CH10 and CH12 to CH15 are used as signal pair channels for general output. The signal pair channels CH1 to CH3, CH5, CH7, CH8, CH10, and CH12 to CH15 receive and transmit the output signals transmitted by the integrated circuit 100. the signal pair channel CH4 shields the interference between the signal pair channel CH3 and the signal pair channel CH5, the signal pair channel CH6 shields the interference between the signal pair channel CH5 and the signal pair channel CH7, the signal pair channel CH9 shields the interference between the signal pair channel CH8 and the signal pair channel CH10, and the signal pair channel CH11 shields the interference between the signal pair channel CH10 and the signal pair channel CH12.

In some embodiments, as illustrated in FIG. 4, The integrated circuit 100 in FIG. 2 further includes the ground wire G. The ground wire G extends from the integrated circuit 100 to the signal pair channels CH7 and CH8 and is adjacent to the signal pair channels CH7 and CH8. The ground wire G is configured to shield the signal pair channels CH7 and CH8.

In some embodiments, the control circuit 110 of the integrated circuit 100 in FIG. 2 is further configured to select the first part of the output terminals according to the wire lengths of the signal pair channels to output the output signals to the first part of the signal pair channels, and to select the second part of the output terminals according to the wire lengths of the signal pair channels to output the output signals to the second part of the signal pair channels.

In some embodiments, the control circuit 110 determines that the signal pair channels with longer wire lengths need to be shielded to reduce interference, and the control circuit 110 configures the output signals so that the signal pair channels with longer wire lengths is adjacent to the signal pair channels used for shield. Furthermore, for the signal pair channel with the longest wire length or the signal pair channel closest to the center, the best shield effect can be achieved by setting the ground wire G.

For example, in the case of FIG. 4, it is assumed that the wire length of the signal pair channel closer to center C is longer. In this case, a ground wire G is configured between the signal pair channels CH7 and CH8, which are closest to the center C. The signal pair channel CH5 second closest to the center C is shielded through the signal pair channels CH4 and CH6, and the signal pair channel CH10 second closest to the center C is shielded through the signal pair channels CH9 and CH11.

Figure 5:
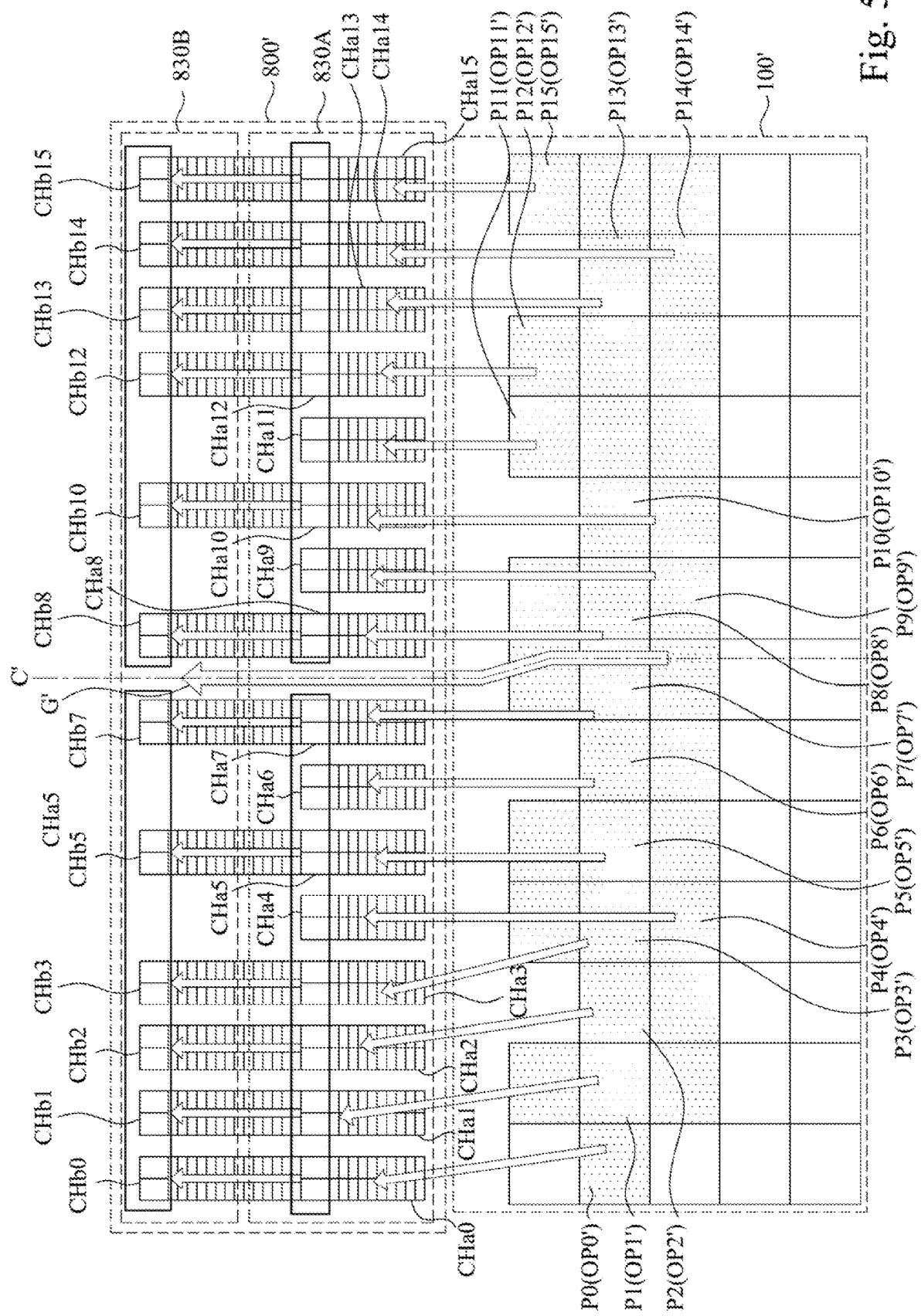
FIG. 5 is a schematic diagram illustrating a signal transmission between the integrated circuit and the circuit board according to some embodiments of the present disclosure.

Reference is made to FIG. 5. FIG. 5 is a schematic diagram illustrating a signal transmission between the integrated circuit and the circuit board according to some embodiments of the present disclosure. As illustrated in FIG. 5, the integrated circuit 100' and the circuit board 800' are connected to each other.

As illustrated in FIG. 5, the integrated circuit 100' includes several pads P0 to P15, the pads P0 to P15 are configured to serve as output signals to the output terminals OP0' to OP15' of the circuit board 800'. The circuit board 800' includes the signal transmission interfaces 830A and 830B. The signal transmission interface 830A includes 16 signal pair channel CHa0 to CHa15. The signal transmission interface 830B includes 12 signal pair channels CHb0 to CHb3, CHb5, CHb7, CHb8, CHb10, and CHb12 to CHb15.

In the connection relationship, the pad P0 works as output terminal OP0' to output signals to the signal pair channel CHa0, and the pad P1 works as output terminal OP1' to output signals to signal pair channel CHa1, and so on.

Since the number of the signal pair channels of the signal transmission interface 830A is 16, compared with the number of signal pair channels of the signal transmission interface 830B (12), the number of the signal pair channels of the signal transmission interface 830A is larger, the control circuit 110 determines that there are 4 signal pair channels of the signal transmission interface 830A that are not used or need not be used, so there are 4 signal pair channels that can be used as signal pair channels for the shield.

In some embodiments, the signal transmission interface 830A is a VBY1 (V-by-One) interface, and the signal transmission interface 830B is a CEDS (Clock Embedded Differential Signal) interface. The above interface is for illustrative purposes only, and the embodiments of the present disclosure are not limited thereto.

In FIG. 5, assume that the wire length of the signal pair channel closer to center C' is longer. In this case, a ground wire G' is configured to locate between the signal pair channels CHa7 and CHa8, which are closest to the center C', and the ground wire G' is also configured to locate between the signal pair channels CHb7 and CHb8, which are closest to the center C'. For the rest of the signal pair channels, the control circuit of the integrated circuit 100' takes the signal pair channels CHa4, CHa6, CHa9 and CHa11 as signal pair channels with shield effect.

As illustrated in FIG. 5, the signal pair channel used as a shield and the signal pair channel used as a general transmission are intersected with each other, so as to shield the signal pair channel used for general transmission through the signal pair channel with a shield effect.

Take FIG. 5 as an example. The signal pair channels CHa0 to CHa3, CHa5, CHa7, CHa8, CHa10, CHa12 to CHa15 are signal pair channels for general transmission, and the signal pair channels CHa4, CHa6, CHa9, and CHa11 are signal pair channels used as shields.

In the example of FIG. 5, limited by the number of signal pair channels, it is impossible to make all the signal pair channels used for general transmission to be intersected (or crossed) with the signal pair channels used as shield. The control circuit of the integrated circuit 100' makes the signal pair channels CHa3, CHa5, and CHa7, which are closer to center C' and are used as general transmission, intersect with the signal pair channels CHa4, CHa6, which are used as shields. Similarly, the control circuit of the integrated circuit 100' makes the signal pair channels CHa8, CHa10, and CHa12, which are closer to the center C' and are used as general transmission, intersect with the signal pair channels CHa9, CHa11, which are used as shields.

In signal transmission, the signal pair channel CHa0 transmits the output signal to the signal pair channel CHb0, the signal pair channel CHa1 transmits the output signal to the signal pair channel CHb1, and so on.

In some embodiments, the integrated circuit 100 makes the signal pair channel a signal pair channel for shielding by inputting high impedance obstructive state signal or direct current voltage to the signal pair channel.

In some embodiments, the signal pair channel CH4 with shield effect is pulled to the ground through the pad of the integrated circuit 100' and the multiplexer which is connected with the pad to increase the shield effect.

According to the above content, in some embodiments, based on the position of the signal pair channels CHa0 to CHa15, CHb0 to CHb3, CHb5, CHb7, CHb8, CHb10, CHb12 to CHb15 and the number of the signal pair channels CHa0 to CHa15, CHb0 to CHb3, CHb5, CHb7, CHb8, CHb10, CHb12 to CHb15, the integrated circuit 100' configures the output signals and outputs the output signals to the signal pair channels CHa0 to CHa15, CHb0 to CHb3, CHb5, CHb7, CHb8, CHb10, CHb12 to CHb15.

Figure 6:
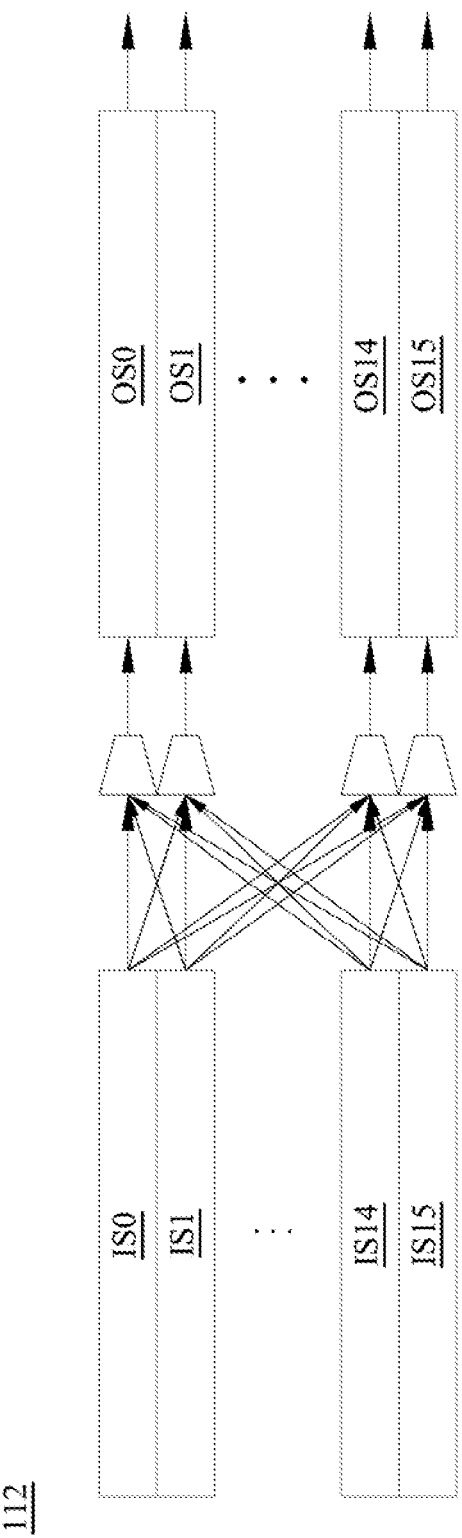
FIG. 6 is a schematic diagram illustrating a multiplexer as illustrated in FIG. 2 according to some embodiments of the present disclosure.

Reference is made to FIG. 6. FIG. 6 is a schematic diagram illustrating the multiplexer 112 as illustrated in FIG. 2 according to some embodiments of the present disclosure. The multiplexer 112 shown in FIG. 6 can transfer the output signals of each signal pair channel to any other signal pair channel. In detail, the output signal IS0 originally outputs to the signal pair channel CH0 can be transferred to be any one of the output signals OS0 to OS15 output to the signal pair channels CH0 to CH15, and the output signal IS1 can be transferred to be any one of the output signals OS0 to OS15 output to the signal pair channels CH0 to CH15, and so on for the rest.

Through the setting of the multiplexer 112, the control circuit 110 can output the output signals to the signal pair channels configured for general transmission according to the configuration of the integrated circuit 100. In some embodiments, the multiplexer 112 outputs the output signals to the signal pair channels configured for general transmission among the signal pair channels.

Reference is made to FIG. 1 and FIG. 4 again. As illustrated in FIG. 1 and FIG. 4, each of the signal pair channels CH0 to CH15 includes two sub signal pair channels. As shown in FIG. 1, each of the output terminals OP0 to OP15 includes two sub output terminals, and between the sub output terminals of the output terminals OP0 to OP15 and the sub signal pair channels of the signal pair channels CH0 to CH15, the relationship is a one-to-one connection.

Reference is made to FIG. 4. In some embodiments, if that the width of the sub signal pair channel is W, the distance between the sub signal pair channels is 0.5 W, the distance between the two general transmission signal pair channels sandwiching the ground wire is 3 W, the distance between two signal pair channels for general transmission sandwiching the signal pair channel for shield is 4 W to 5 W, and the distance between two signal pair channels for general transmission with no ground wire and no signal pair channel for shield sandwiching between them is 1 W.

As illustrated in FIG. 4, there is no ground wire or shield between the signal pair channels CH14 and CH15 for general transmission, and the distance between the signal pair channels CH14 and CH15 is 1 W. The signal pair channels CH8 and CH10 for general transmission is sandwiching the signal pair channel CH9 for shield, and the distance between the signal pair channels CH8 and CH10 is 4 W to 5 W. A ground wire is sandwiched between the signal pair channels CH7 and CH8 for general transmission, and the distance between the signal pair channels CH7 and CH8 is 3 W.

Furthermore, the distance between two sub signal pair channels of a signal pair channel is 0.5 W. For example, the distance between two sub signal pair channels of the signal pair channel CH8 is 0.5 W.

It should be noted that, the distance between the signal pair channels is not limited to the above.

In some embodiments, the signal pair channel is a differential signal pair channel.

To sum up, the embodiments of the present disclosure provide an integrated circuit and a signal transmission method, by using the unused signal pair channel as the signal pair channel for the shield, the effect of reducing the interference between the signal pair channels can be achieved without increasing the line or ground wire. In addition, according to the number, positions and wire lengths of the signal pair channels, the signal pair channels for general transmission and the signal pair channels for shield can be used to reduce the interference between the signal pair channels more effectively.

In addition, it should be noted that in the operations of the above mentioned signal transmission method, no particular sequence is required unless otherwise specified. Moreover, the operations may also be performed simultaneously or the execution times thereof may at least partially overlap.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An integrated circuit, coupled to a circuit board, the circuit board comprises a plurality of signal pair channels, wherein the integrated circuit comprises:
    a plurality of output terminals; and
    a control circuit, coupled to the plurality of output terminals, configured to configure a plurality of output signals output to the plurality of signal pair channels by the plurality of output terminals, so that a first signal pair channel and a second signal pair channel of the plurality of signal pair channels receive and output the plurality of output signals, so that a third signal pair channel of the plurality of signal pair channels shields an interference between the first signal pair channel and the second signal pair channel, wherein the third signal pair channel is adjacent to the first signal pair channel and the second signal pair channel, and the third signal pair channel is located between the first signal pair channel and the second signal pair channel.

2. The integrated circuit of claim 1, wherein the control circuit is further configured to configure a first part of the plurality of output terminals to output the plurality of output signals to a first part of the plurality of signal pair channels, and to configure a second part of the plurality of output terminals to output a plurality of shield signals to a second part of the plurality of signal pair channels, so that the second part of the plurality of signal pair channels shields an interference between the first part of the plurality of signal pair channels.

3. The integrated circuit of claim 2, wherein the plurality of shield signals comprise a plurality of high impedance obstructive state signals.

4. The integrated circuit of claim 2, wherein the plurality of shield signals comprises a plurality of direct current voltages.

5. The integrated circuit of claim 2, wherein the second part of the plurality of signal pair channels intersects between the first part of the plurality of signal pair channels.

6. The integrated circuit of claim 2, wherein the control circuit is further configured to select the first part of the plurality of output terminals according to a plurality of wire lengths of the plurality of signal pair channels to output the plurality of output signals to the first part of the plurality of signal pair channels.

7. The integrated circuit of claim 2, wherein the control circuit further comprises:
    a multiplexer, configured to output the plurality of output signals to the first part of the plurality of signal pair channels.

8. The integrated circuit of claim 1, further comprising:
    a ground wire, wherein the ground wire is extended from the integrated circuit to the circuit board, and is located between a fourth signal pair channel and a fifth signal pair channel of the plurality of signal pair channels, and the ground wire is adjacent to the fourth signal pair channel and the fifth signal pair channel, so as to shield an interference between the fourth signal pair channel and the fifth signal pair channel;
    wherein the fourth signal pair channel and the fifth signal pair channel receive and output the plurality of output signals.

9. The integrated circuit of claim 1, wherein the plurality of output terminals transmit the plurality of output signals to the plurality of signal pair channels through a connector.

10. The integrated circuit of claim 1, wherein the third signal pair channel is pulled to ground through a pad.

11. A signal transmission method, suitable for an integrated circuit, wherein the integrated circuit is coupled to a circuit board, the circuit board comprises a plurality of signal pair channels, wherein the signal transmission method comprises:
    configuring a plurality of output signals output to the plurality of signal pair channels of the integrated circuit by a plurality of output terminals by a control circuit of the integrated circuit; and outputting the plurality of output signals by a plurality of output terminals of the integrated circuit, so that a first signal pair channel and a second signal pair channel of the plurality of signal pair channels receive and output the plurality of output signals, so that a third signal pair channel of the plurality of signal pair channels shields an interference between the first signal pair channel and the second signal pair channel;

wherein the third signal pair channel is adjacent to the first signal pair channel and the second signal pair channel, and the third signal pair channel is located between the first signal pair channel and the second signal pair channel.

12. The signal transmission method of claim 11, further comprising:
configuring a first part of the plurality of output terminals to output the plurality of output signals to a first part of the plurality of signal pair channels; and
configuring a second part of the plurality of output terminals to output a plurality of shield signals to a second part of the plurality of signal pair channels, so that the second part of the plurality of signal pair channels shields an interference between the first part of the plurality of signal pair channels.

13. The signal transmission method of claim 12, wherein the plurality of shield signals comprise a plurality of high impedance obstructive state signals.

14. The signal transmission method of claim 12, wherein the plurality of shield signals comprise a plurality of direct current voltages.

15. The signal transmission method of claim 12, wherein the second part of the plurality of signal pair channels intersects between the first part of the plurality of signal pair channels.

16. The signal transmission method of claim 12, wherein the control circuit is further configured to select the first part of the plurality of output terminals according to a plurality of wire lengths of the plurality of signal pair channels to output the plurality of output signals to the first part of the plurality of signal pair channels.

17. The signal transmission method of claim 12, further comprising:
outputting the plurality of output signals to the first part of the plurality of signal pair channels by a multiplexer of the control circuit.

18. The signal transmission method of claim 11, further comprising:
shielding an interference between a fourth signal pair channel and a fifth signal pair channel of the plurality of signal pair channels by a ground wire of the integrated circuit;
wherein the ground wire is located between the fourth signal pair channel and a fifth signal pair channel, and the ground wire is adjacent to the fourth signal pair channel and the fifth signal pair channel;
wherein the fourth signal pair channel and the fifth signal pair channel receive and output the plurality of output signals.

19. The signal transmission method of claim 11, further comprising:
transmitting the plurality of output signals to the plurality of signal pair channels by the plurality of output terminals through a connector.

20. The signal transmission method of claim 11, wherein the third signal pair channel is pulled to ground through a pad.

* * * * *